United States Patent [19]

Yuyama et al.

[11] Patent Number: 5,046,017

[45] Date of Patent: Sep. 3, 1991

[54] WIRING DESIGN FOR SEMICONDUCTOR INTEGRATED CIRCUIT

[75] Inventors: Kyoji Yuyama, Shiroyama; Kouichi Nishizawa, Aizuwakamatsu, both of Japan

[73] Assignees: Hitachi, Ltd.; Hitachi Microcomputer Engineering, Ltd., both of Tokyo, Japan

[21] Appl. No.: 287,059

[22] Filed: Dec. 21, 1988

[30] Foreign Application Priority Data

Dec. 23, 1987 [JP] Japan .................. 62-324072

[51] Int. Cl.⁵ .............................. G06F 15/60
[52] U.S. Cl. .................. 364/491; 364/490; 364/489; 364/488
[58] Field of Search ............... 364/488, 489, 490, 491

[56] References Cited

U.S. PATENT DOCUMENTS 4,754,408 6/1988 Carpenter et al. ............ 364/491
4,777,606 10/1988 Fournier ..................... 364/491

OTHER PUBLICATIONS

"LAS: Layout Pattern Analysis System with New Approach", by Y. Okamura et al., 1982 IEEE, pp. 308-311.
"EXCL: A Circuit Extractor for IC Designs", by S. P. McCormick, 21st Design Automation Conf., IEEE 1984, pp. 616-623.
"Resistance Extraction in a Hierarchical IC Artwork Verification System", by S. Mori et al., IEEE 1985, pp. 196-198.
"PANAMAP-B: A Mask Verification System for Bipolar IC", by J. Yoshida et al., 18th Design Automation Conf., IEEE 1981, pp. 690-695.

Primary Examiner—Parshotam S. Lall
Assistant Examiner—V. N. Trans
Attorney, Agent, or Firm—Antonelli, Terry, Stout & Kraus

[57] ABSTRACT

A method of designing semiconductor integrated circuits wherein rough routes are designated after a process of design for cells layout is completed, then wirings between cells are supposed automatically on the basis of the designated rough routes, investigation of the characteristic of the wirings is executed, and after a target characteristic is attained, a wiring pattern satisfying all of required electrical and physical conditions, including layout rules, i.e. a detailed wiring pattern, is prepared.

9 Claims, 5 Drawing Sheets

WIRING DESIGN FOR SEMICONDUCTOR INTEGRATED CIRCUIT

BACKGROUND OF THE INVENTION

This invention relates to a method of designing a semiconductor integrated circuit, which may be effectively applicable, for instance, to designing full-custom LSI (large-scale integrated circuit) for specific uses.

The investigation of characteristics LSI is discussed in CICC (1987), pp. 133 to 136. According to this paper, the characteristics are evaluated by determining the wiring resistances and capacitances of a detailed wiring pattern prepared beforehand.

A method for setting a layout of elements in an LSI is described in a Japanese Patent Application which was laid open to public inspection on Feb. 20, 1987 under Provisional Publication No. 39024/87. According to this method, first the layout of elements is set tentatively, and then tentative wiring routes are set. In accordance with theoretical lengths of wirings based on the tentative wiring routes, signal delays are estimated, and the results of this estimate are reflected on the layout of elements. It is disclosed in the above method employing the tentative wiring routes that a technique such as the Steiner tree method is adopted.

Additionally, there is described a method of establishing roundabout routes by setting turning points.

Before the actual wiring pattern of an LSI, it is necessary to prepare a detailed wiring pattern (including the examination of through holes etc.) and check its characteristics. The preparation of such a detailed wiring pattern requires many man-hours because it must meet all required electrical and physical conditions, including layout rules. Accordingly, the problem with the above-described method is that the man-hours taken to design an LSI greatly increases if a detailed wiring pattern is prepared repeatedly until desired results are obtained at the investigation of characteristics.

It is necessary, therefore, to estimate the characteristics of the detailed wiring pattern prior to the preparation thereof. To this end, a tentative wiring pattern for the investigation of characteristics must be prepared. Such a tentative pattern is required to closely resemble the final wiring pattern in order to accurately estimate the final characteristics. However, an attempt to make it too close to the final pattern involves increased man-hours so that the total design costs for an LSI cannot be reduced.

SUMMARY OF THE INVENTION

This invention is based on the results of revelation and analysis of problems of the above-described prior art by the present inventors.

One object of this invention is to accurately estimate the characteristic of a wiring pattern and also to provide a method of designing a semiconductor integrated circuit wherein a substantial man-hour reduction is realized in LSI design.

The above-mentioned and other objects and novel features of this invention will be apparent from the description of the present specification and the accompanying drawings.

Typical variations of inventions disclosed in the present application will be summarized simply as in the following. That is, a signal name is given to each wiring and an image of a rough route therefor is designated after a process of design for cells layout is ended, and based on the designated wiring route, a wiring between cells is supposed automatically so as to execute the investigation of the characteristic thereof.

According to the means stated above, only the designation of the rough route is needed for preparation of a wiring pattern for the investigation of characteristic, and a wiring pattern that satisfies all of required electrical and physical conditions, including layout rules, may be prepared after a target characteristic is attained. Accordingly, a sharp reduction in the number of processes for design can be realized, and also a highly precise estimate of characteristic being approximate to the final wiring pattern is enabled by designating rough routes.

DESCRIPTION OF THE PREFERRED EMBODIMENTS

Figure 1A:
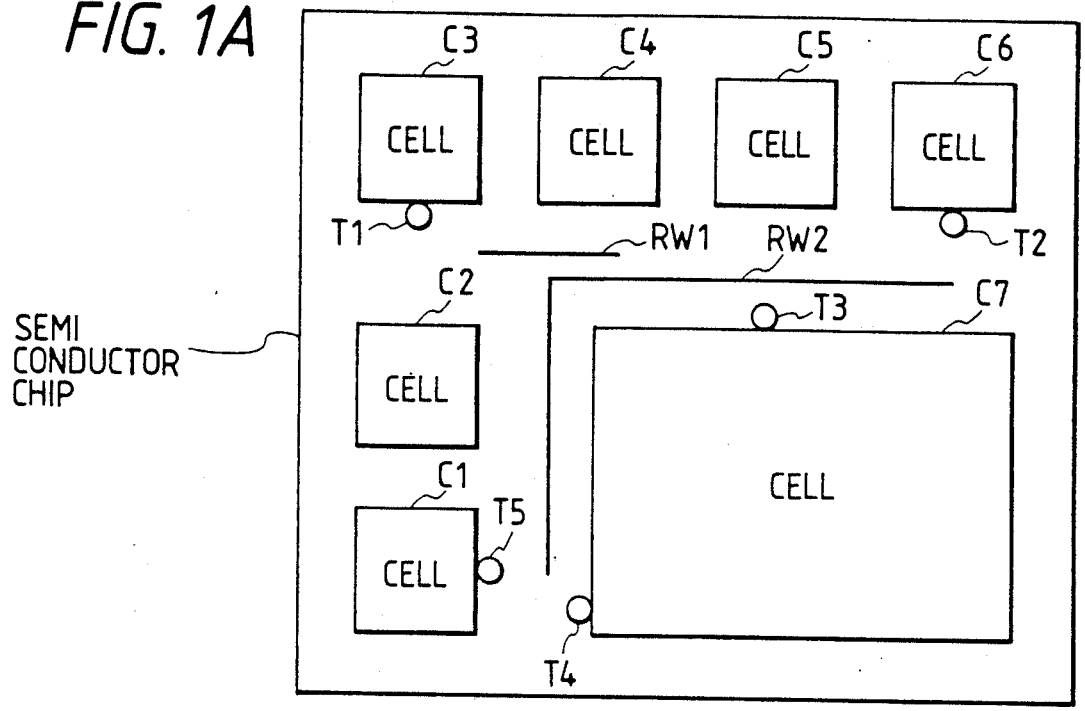
FIG. 1A is a schematic block diagram illustrating manual data entry in a design method according to one embodiment of this invention.

FIG. 1A shows a schematic block diagram illustrating manual data entry in a method according to one embodiment of this invention.

Cells C1 to C7 to be prepared on a semiconductor chip 4 are laid out. Herein a cell means a collective circuit (unit block circuit) which executes some function. Accordingly, the cell may be a unit circuit such as an inverter, AND or OR, or a block circuit such as an input buffer, an output buffer or further a memory array. Cells are standardized generally, and a cell to be employed is designated out of the ones prepared. In this process, design for cells for specific uses may be included. A terminal name or a signal name is given to an input or output terminal of each cell. For instance, the cells C1, C3 and C6 are provided with terminals T5, T1 and T2 respectively, while the cell C7 is provided with terminals T3 and T4.

When the layout of the aforesaid cells is ended, general wiring routes (rough wiring routes) RW1 and RW2 are designated. These rough wiring routes RW1 and RW2 are given names of signals which are to be transmitted through wirings laid along the routes, respectively.

Such a drawing as shown in FIG. 1A is displayed on an image plane of a graphic terminal (display unit), and as for the routes of the aforesaid wirings, only the simple designation of starting and ending points is needed for the straight route RW1, while only the designation of points connected by straight lines is needed for the bent route RW2. Corresponding to these designations for the routes, names of signals to be passed therethrough are given to them respectively.

Figure 1B:
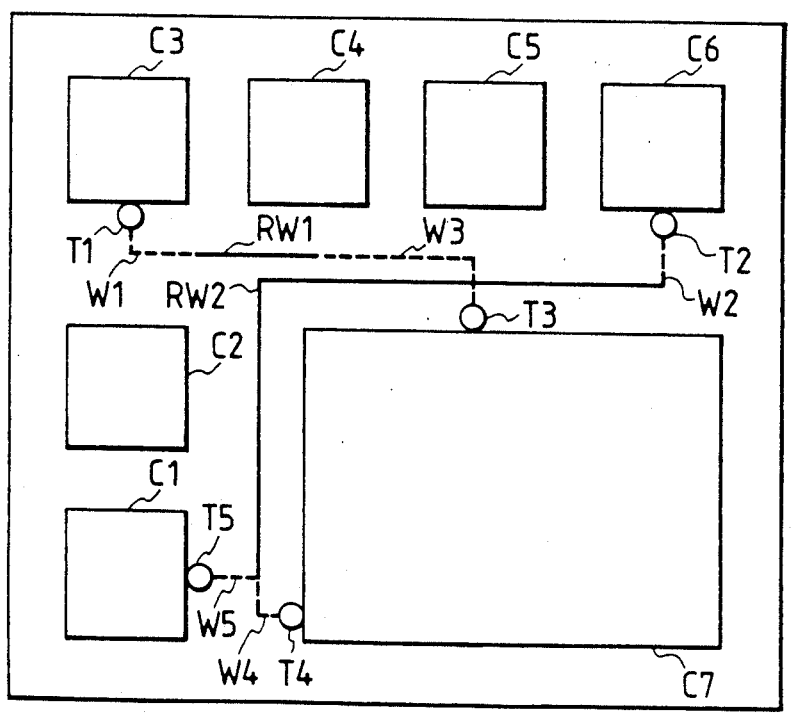
FIG. 1B is a schematic block diagram illustrating the investigation of characteristic using a computer system in a design method according to one embodiment of this invention.

A schematic block diagram of one embodiment wherein the characteristic investigation by a computer system in the method of this invention is figured is shown in FIG. 1B.

Based on the data inputted as described above, first the wiring routes are supposed automatically by the computer system. For instance, such supposed shapes of wirings W1 to W5 as indicated by dotted lines in the same figure are determined from the terminal names (signal names) of the aforesaid cells and the signal names of the wiring routes corresponding thereto respectively. A technique such as the Steiner tree method or minimum spanning tree method, for instance, is used for supposing these shapes of wirings. These supposed shapes of wirings may not satisfy all of required electrical and physical conditions, including layout rules, in a semiconductor integrated circuit. In the supposition of these shapes of wirings, therefore, wiring routes among cells are only supposed.

Figure 2:
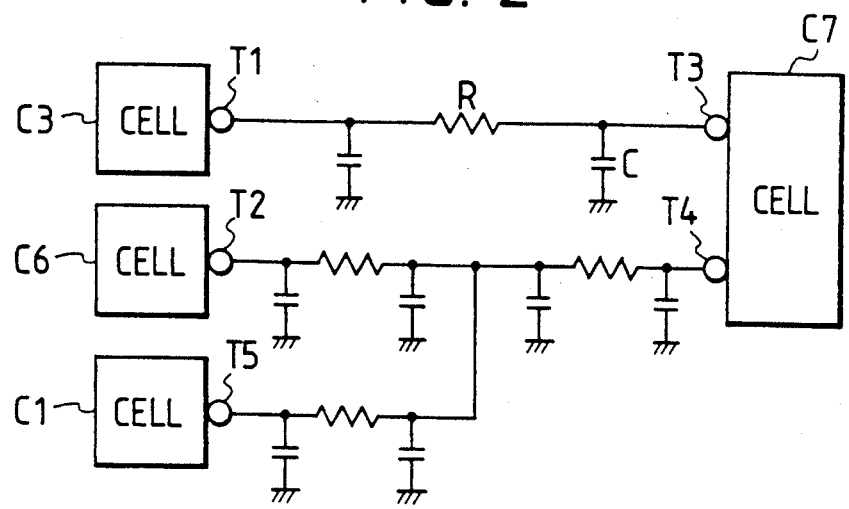
FIG. 2 is an equivalent circuit diagram thereof.

The investigation of characteristic is started after the wirings W1 to W5 are supposed as described above. Since each wiring route is determined from the above-mentioned rough wiring routes and the supposed shapes of wirings, concretely, a wiring resistance value and a parasitic capacitance are supposed on the basis of the determined wiring route. In other words, since the wiring route is determined as described above in such a manner as shown in an equivalent circuit diagram of FIG. 2, the length of each route is calculated. By using this wiring length and a resistance value and a capacitance value of the wiring pattern for a unit length which are given separately, a resistance value R and a capacitance value C in each wiring pattern are determined respectively.

The data thus prepared are transferred to a characteristic investigating apparatus or a characteristics investigating program in the computer system, and the investigation of characteristic is executed.

If it is determined that the target characteristic is not obtained, as the result of the aforesaid investigation of characteristic, a return is made to the operation in FIG. 1A, and with the layout of each cell and the rough wiring routes altered, the same operation is repeated. When it is determined by the investigation of characteristic that the target characteristic is obtained, such a detailed design for wirings as to satisfy all of the required electrical and physical conditions, including layout rules, in the aforesaid semiconductor integrated circuit is executed.

Figure 3:
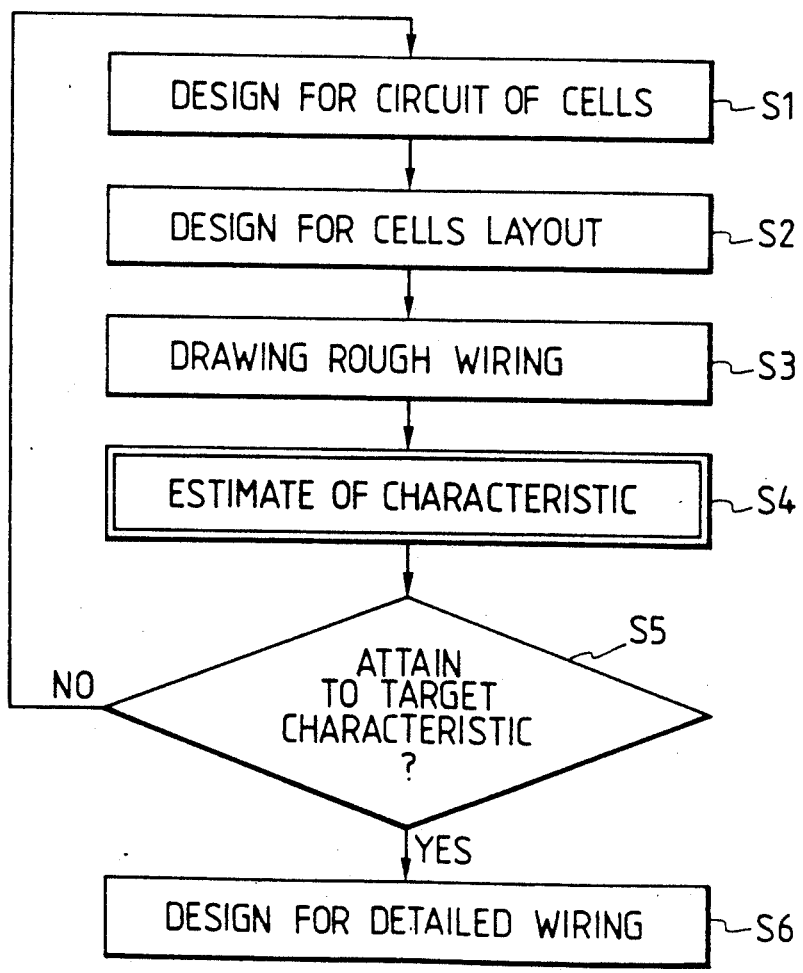
FIG. 3 and FIG. 4 are flowcharts for explaining the method of design according to this invention.

FIG. 3 is a flowchart of a process of design as described above.

When design for circuit of cells (step S1) and design for cells layout (S2) are ended, concretely, only an operation of drawing rough wirings (S3) is executed, and thereafter supposition of shapes of wirings and calculation of resistance and capacitance values for the characteristic investigation by using the computer system and subsequent estimate of characteristic (S4) are executed. When it is determined that the target characteristic is not attained (step S5), only a relatively simple process, such as redoing of design for cells, alteration of cells layout or alteration of rough wiring routes, is added. Then, after it is determined that the target characteristic is attained, all of the required electrical and physical conditions, including the layout rules (examination of through holes etc.), in an actual semiconductor integrated circuit are taken into consideration, and a design for detailed wirings (step S6) which satisfies these conditions is executed. Then, after the aforesaid design for detailed wirings is executed, the characteristic investigation for confirmation is executed again, if necessary, though not shown in the figure.

When it is assumed, incidentally, that the number of processes spent for the aforesaid designs for cells and cells layout and the operation for drawing rough wirings is five and that the number of processes spent for the design for detailed wirings is five, and if the target characteristic is not attained twice in the characteristic investigation, the processes for the aforesaid designs for cells and cells layout and the operation for drawing rough wirings are to be executed three times respectively according to the method of the present invention. Therefore, the number of processes required for the design of the semiconductor integrated circuit is merely $5 \times 3 + 5 = 20$.

According to the prior art, in contrast, the number of all the processes becomes as large as $3 \times (5+5) = 30$ when the target characteristic is not attained twice in the characteristic investigation in the same way as in the above, because the design for detailed wirings needs to be conducted on each such occasion.

Figure 4:
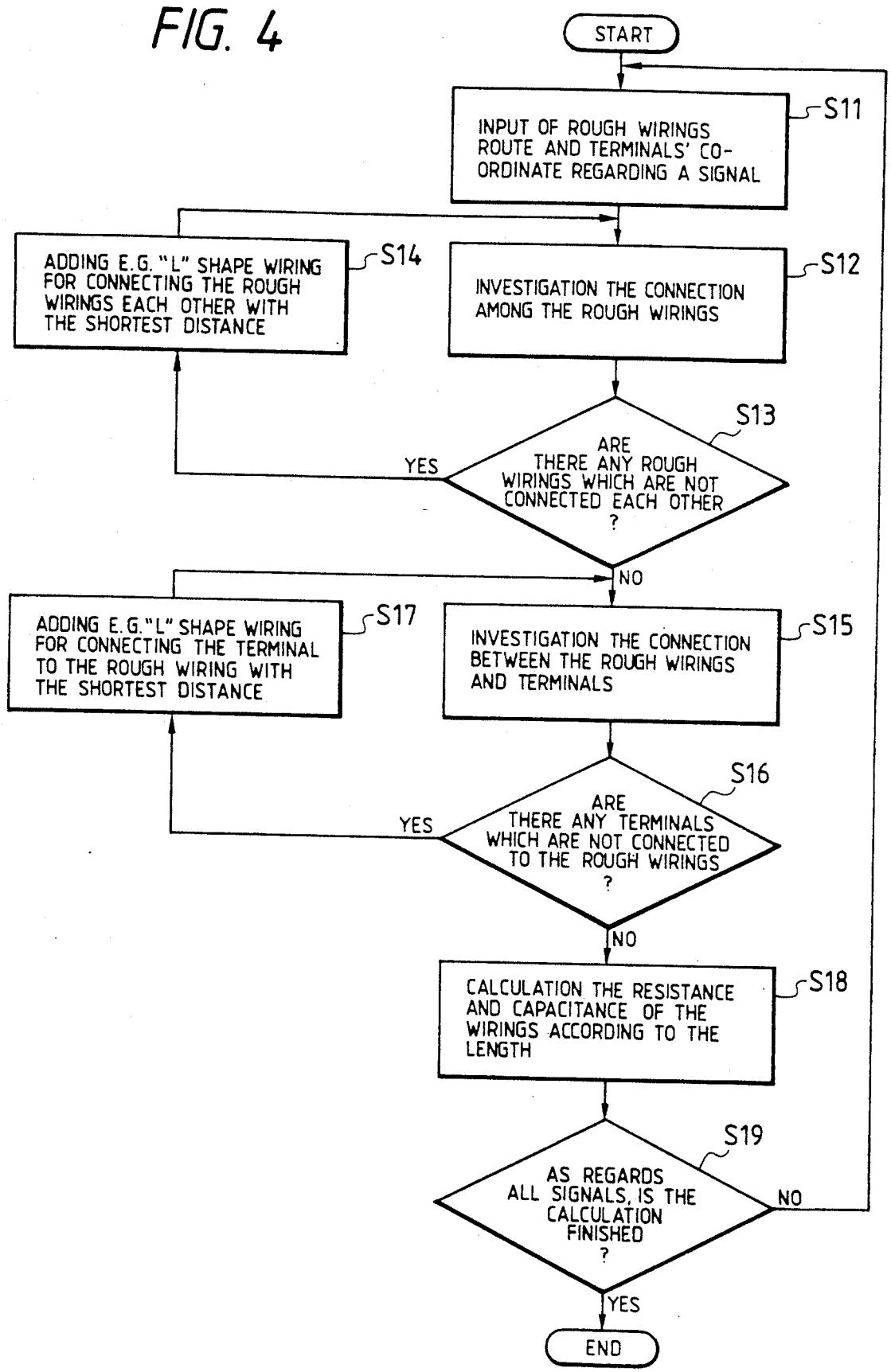

FIG. 4 is a flowchart showing another embodiment of the method of the present invention. Also, FIGS. 5A, 5B, 5C and 5D are drawings for illustrating the contents of processings by processing steps S11, S14, S17 and S18 shown in FIG. 4, respectively.

Figure 5A:
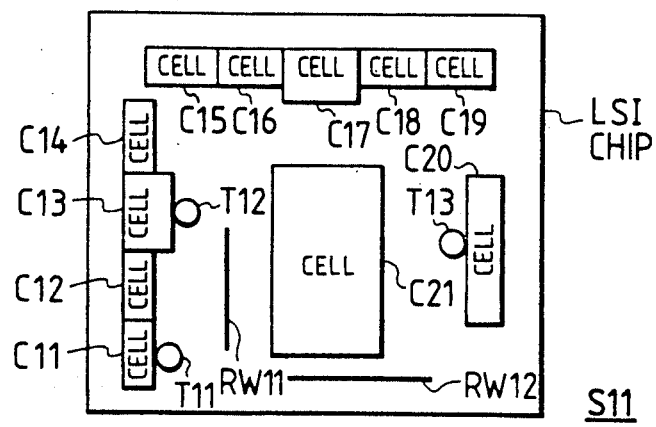
FIGS. 5A to 5D are diagrams illustrating principal processing steps in the flowchart shown in FIG. 4, and FIGS. 6A to 6C are diagrams illustrating a design method according to another embodiment of this invention.

At the step 11, cells C11 to C21 are laid out and the positions on coordinates of input or output terminals of the cells, e.g. terminals T11, T12 and T13, are determined, as shown in FIG. 5A. Moreover, the positions on coordinates of rough wirings RW11 and RW12 for connecting the terminals T11, T12 and T13 mutually are determined.

At a step 12, the states of mutual connections of the rough wirings RW11 and RW12 are investigated. When it is judged at a step 13 that the rough wirings are not connected to each other, branching is made to the step 14, and when it is judged that they are connected to each other, transfer is made to a step 15.

Figure 5B:
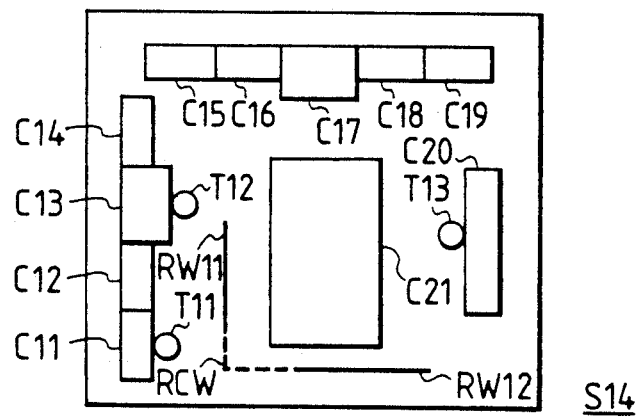

At the step 14, a connective wiring RCW, which is the shortest wiring for connecting the wirings RW11 and RW12 and is shaped in L, for instance, is added as shown in FIG. 5B.

At the step 15, the states of mutual connections between the wirings RW11, RCW, RW12 and the terminals T11, T12, T13 are investigated. When it is judged that the wirings are not connected to the aforesaid terminals T11, T12 and T13 at a step 16, branching is made to the step 17, and when it is judged that they are connected to these terminals, transfer is made to the step 18.

Figure 5C:
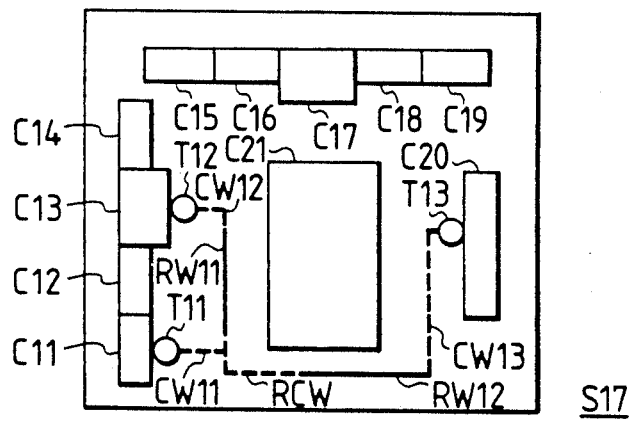

At the step 17, a straight wiring CW11 connecting the terminal T11 to the wiring RCW, an L-shaped wiring CW12 connecting the terminal T12 to the wiring RW11 and an L-shaped wiring CW13 connecting the terminal T13 to the wiring RW12 are added respectively as shown in FIG. 5C.

Figure 5D:
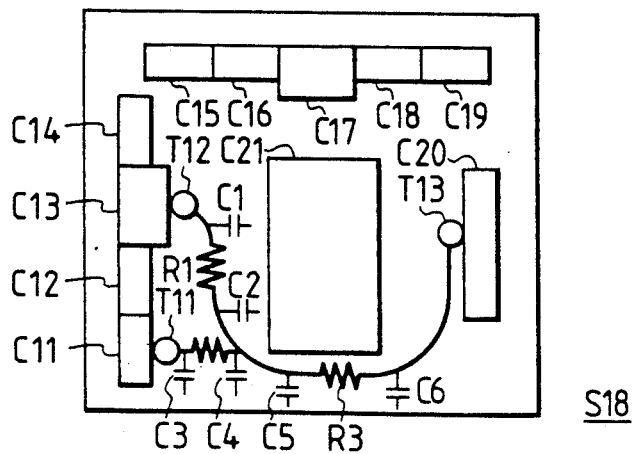

At the step 18, wiring resistances R1 to R3 and wiring capacitances C1 to C6 are calculated as shown in FIG. 5D, and an estimate of the characteristic of the wirings is executed. At a step 19, it is judged whether processings for all signal wirings to be estimated are finished or not, and a return is made to the step 11 when they are not yet finished.

Since the rough wirings RW11 and RW12 can be set first when the tentative wiring routes for the estimate of characteristic are set, according to the present invention, tentative wirings approximating very much to final detailed wirings can be set. Accordingly, a highly precise estimate of characteristic can be realized. Moreover, the above-mentioned rough wiring routes can be set freely and manually by a wiring route setting operator who watches the same on the image plane of a graphic terminal during the operation, and therefore a high freedom of setting the wiring routes is obtained. Accordingly, it is also possible to adjust a signal delay manually by making the wiring route roundabout intentionally.

Figure 6A:
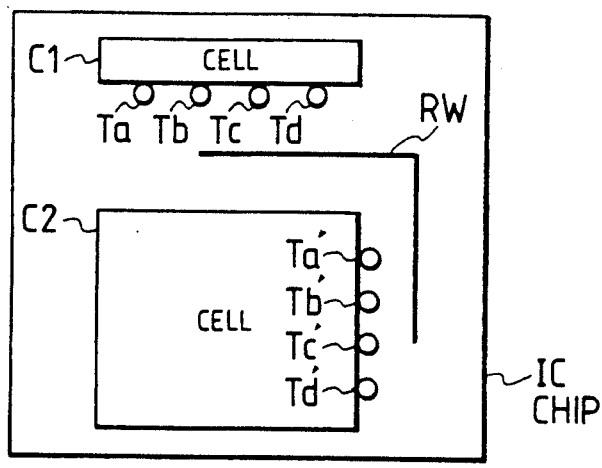
Figure 6B:
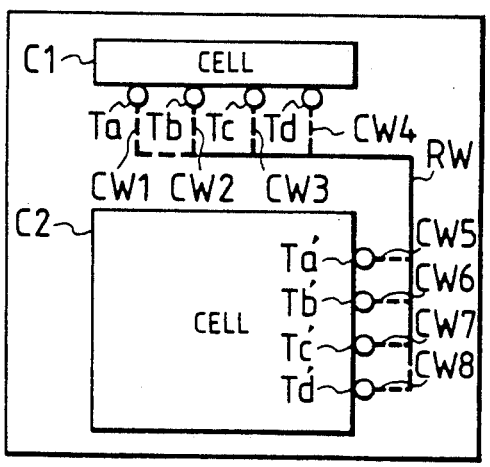
Figure 6C:
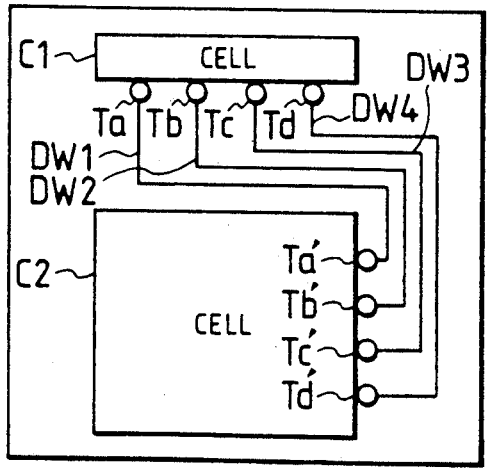

FIGS. 6A to 6C show one embodiment of the relationships between a rough wiring RW and final detailed wirings DW1 to DW4. FIG. 6A shows a state wherein cells C1 and C2 and the rough wiring RW are set on a semiconductor chip. The cell C1 is provided with terminals Ta, Tb, Tc and Td, while the cell C2 is provided with terminals Ta', Tb', Tc' and Td' corresponding to the aforesaid terminals Ta, Tb. Tc and Td and to be connected thereto respectively. FIG. 6B shows a state wherein supposed wirings CW1 to CW8 between the aforesaid rough wiring RW and the terminals Ta, Tb, Tc, Td, Ta', Tb', Tc' and Td' are set. FIG. 6C shows the shapes of detailed wirings DW1 to DW4 which are formed finally. By conducting the estimate of characteristic of a plurality of wirings DW1 to DW4 on the basis of one rough wiring RW in this way, the estimate of characteristic can be performed efficiently.

The invention of the present application filed by the present inventors, which is described above concretely on the basis of the embodiments, is not limited to these embodiments, but can be modified variously, of course, within a scope not deviating from the purport thereof. As for the technique of supposing the shapes of wirings between cells from the layout of the cells and a rough wiring image, for instance, any techniques other than the above-mentioned Steiner tree method and minimum spanning tree method may also be adopted. As for a method for inputting the layout of cells and the rough wiring image, besides, various modes can be taken in accordance with a computer system employed.

This invention can be used extensively as a system of design for semiconductor integrated circuits.

What is claimed is:

1. A method of designing a semiconductor integrated circuit device comprising the steps of:
    positioning a first circuit block in said semiconductor integrated circuit device;
    positioning a signal terminal on said first circuit block;
    positioning a second circuit block in said semiconductor integrated circuit device;
    positioning a signal terminal on said second circuit block;
    positioning a first partial wiring which constitutes only a portion of a first wiring to be formed in said semiconductor integrated circuit device for connecting said signal terminal of said first circuit block and said signal terminal of said second circuit block; and
    estimating characteristics of said first wiring based on position information of said terminal of said first circuit block, position information of said terminal of said second circuit block, and position information of said first partial wiring.

2. A method according to claim 1, further comprising the steps of:
    positioning a second partial wiring which constitutes only a portion of a second wiring to be formed in said semiconductor integrated circuit device for connecting said signal terminal of said first circuit block and said signal terminal of said second circuit block; and
    estimating characteristics of said second wiring based on position information of said signal terminal of said first circuit block, position information of said signal terminal of said second circuit block, and position information of said second partial wiring.

3. A method according to claim 1, further comprising the step of:
    positioning said first wiring based on position information of said terminal of said first circuit block, position information of said terminal of said second circuit block, and position information of said first partial wiring when a result of the estimating of the characteristics of said first wiring attains a predetermined value.

4. A method according to claim 1, wherein:
    the step of positioning said first circuit block includes the steps of displaying and positioning a graphic representation of said first circuit block on a display device;
    the step of positioning said signal terminal of said first circuit block includes the steps of displaying and positioning a graphic representation of said signal terminal of said first circuit block on the display device;
    the step of positioning said second circuit block includes the steps of displaying and positioning a graphic representation of said second circuit block on the display device;
    the step of positioning said signal terminal of said second circuit block includes the steps of displaying and positioning a graphic representation of said terminal of said second circuit block on the display device;
    the step of positioning said first partial wiring includes the steps of displaying and positioning a graphic representation of said first partial wiring on the display device; and
    the estimating step comprises the step of estimating characteristics of said first wiring based on position information of said graphic representation of said signal terminal of said first circuit block, position information of said graphic representation of said signal terminal of said second circuit block, and position information of said graphic representation of said first partial wiring.

5. A method of designing a semiconductor integrated circuit device comprising the steps of:
    positioning a first circuit block in said semiconductor integrated circuit device;
    positioning a signal terminal on said first circuit block;
    positioning a second circuit block in said semiconductor integrated circuit device;
    positioning a signal terminal on said second circuit block;
    positioning a first partial wiring and a second partial wiring, each of said first partial wiring and said second partial wiring constituting only a portion of a first wiring to be formed in said semiconductor integrated circuit device for connecting said signal terminal of said first circuit block and said signal terminal of said second circuit block; and estimating characteristics of said first wiring based on position information of said signal terminal of said first circuit block, position information of said signal terminal of said second circuit block, position information of said first partial wiring, and position information of said second partial wiring.

6. A method according to claim 5, further comprising the step of:

positioning said first wiring based on position information of said terminal of said first circuit block, position information of said terminal of said second circuit block, position information of said first partial wiring, and position information of said second partial wiring.

7. A method according to claim 5, wherein:

the step of positioning said first circuit block includes the steps of displaying and positioning a graphic representation of said first circuit block on a display device;

the step of positioning said signal terminal of said first circuit block includes the steps of displaying and positioning a graphic representation of said signal terminal of said first circuit block on the display device;

the step of positioning said second circuit block includes the steps of displaying and positioning a graphic representation of said second circuit block on the display device;

the step of positioning said signal terminal of said second circuit block includes the steps of displaying and positioning a graphic representation of said terminal of said second circuit block on the display device;

the step of positioning said first partial wiring and said second partial wiring includes the steps of displaying and positioning graphic representations of said first partial wiring and said second partial wiring on the display device; and the estimating step comprises the step of estimating characteristics of said first wiring based on position information of said graphic representation of said signal terminal of said first circuit block, position information of said graphic representation of said signal terminal of said second circuit block, and position information of said graphic representations of said first partial wiring and said second partial wiring.

8. A method of designing a semiconductor integrated circuit device comprising the steps of:

positioning a first circuit in said semiconductor integrated circuit device;

positioning a signal terminal on said first circuit;

positioning a second circuit in said semiconductor integrated circuit device;

positioning a signal terminal on said second circuit;

positioning a first straight-shaped partial wiring which constitutes only a portion of a first wiring to be formed in said semiconductor integrated circuit device for connecting said signal terminal of said first circuit and said signal terminal of said second circuit; and estimating resistance characteristics of said first wiring based on position information of said terminal of said first circuit, position information of said terminal of said second circuit, and position information of said first straight-shaped partial wiring.

9. A method according to claim 8, wherein:

the step of positioning said first circuit includes the steps of displaying and positioning a graphic representation of said first circuit on a display device;

the step of positioning said signal terminal of said first circuit includes the steps of displaying and positioning a graphic representation of said signal terminal of said first circuit on the display device;

the step of positioning said second circuit includes the steps of displaying and positioning a graphic representation of said second circuit on the display device;

the step of positioning said signal terminal of said second circuit includes the steps of displaying and positioning a graphic representation of said signal terminal of said second circuit on the display device;

the step of positioning said first straight-shaped partial wiring includes the steps of displaying and positioning a graphic representation of said first straight-shaped partial wiring on the display device; and the estimating step comprises the step of estimating resistance characteristics of said first wiring based on position information of said graphic representation of said terminal of said first circuit, position information of said graphic representation of said terminal of said second circuit, and position information of said graphic representation of said first straight-shaped partial wiring.

* * * * *